United States Patent [19]

Hayama et al.

[11] Patent Number: 5,609,704

[45] Date of Patent: Mar. 11, 1997

[54] METHOD FOR FABRICATING AN ELECTRONIC PART BY INTAGLIO PRINTING

[75] Inventors: Masaaki Hayama, Nara; Noboru Mohri, Katano; Keiichi Nakao, Hirakata, all of Japan

[73] Assignee: Matsushita Electric Industrial Co., Ltd., Kadoma, Japan

[21] Appl. No.: 309,049

[22] Filed: Sep. 20, 1994

[30] Foreign Application Priority Data

Sep. 21, 1993 [JP] Japan ..................... 5-234522

[51] Int. Cl.$^6$ .................. B32B 31/12; B32B 31/20
[52] U.S. Cl. ............. 156/89; 156/230; 156/233; 156/235; 156/257; 156/272.8; 156/289; 264/61
[58] Field of Search .................. 101/150, 170; 156/230, 233, 89, 249, 289

[56] References Cited

U.S. PATENT DOCUMENTS

| | | | |
|---|---|---|---|
| 3,350,250 | 10/1967 | Sanz et al. | 156/233 X |
| 3,518,130 | 6/1970 | Cacka et al. | 156/233 X |
| 3,597,834 | 8/1971 | Lathrop . | |
| 3,701,317 | 10/1972 | Miyamoto et al. | 101/170 |
| 4,388,865 | 6/1983 | Kellner | 101/150 X |
| 5,127,330 | 7/1992 | Okazaki et al. | 101/450.1 |
| 5,201,268 | 4/1993 | Yamamoto et al. | 101/170 |
| 5,398,400 | 3/1995 | Breen . | |
| 5,408,053 | 4/1995 | Young . | |
| 5,436,412 | 7/1995 | Ahmad et al. . | |

FOREIGN PATENT DOCUMENTS

| | | | |
|---|---|---|---|
| 3327843 | 2/1985 | Germany | 101/150 |
| 3-254857 | 11/1991 | Japan . | |
| 4-246594 | 9/1992 | Japan . | |

Primary Examiner—David A. Simmons
Assistant Examiner—M. Curtis Mayes
Attorney, Agent, or Firm—Renner, Otto, Boisselle & Sklar

[57] ABSTRACT

A pattern, in which a groove of an optional position is deeper than that of the other portion, is formed on a surface of a flexible resin sheet by laser process, and then a fluorine-carbon monomolecular film release layer is formed on the surface of the thus obtained pattern, thereby forming an intaglio plate. The intaglio plate is filled with Ag paste and then dried. The intaglio plate is then laminated onto an insulating substrate, on which a thermoplastic resin layer is formed using heat rollers. Thereafter, the intaglio plate is peeled from the insulating substrate so that the pattern of the Ag paste is transferred thereon, and the conductor pattern is formed through burning. Further, an insulating layer is formed so as to cover the conductor pattern and another conductor pattern is formed on the insulating layer, whereby forming a multilayered structure. In some cases, a difference in height of the lower layer conductor pattern is provided and the higher portion thereof functions as a via hole electrode for electrically connecting the lower and upper conductor patterns. Thus, provided are a method of fabricating electronic parts which is capable of forming fine patterns with high accuracy as well as easily fabricating a multilayered structure of a conductor pattern with high performance.

15 Claims, 13 Drawing Sheets

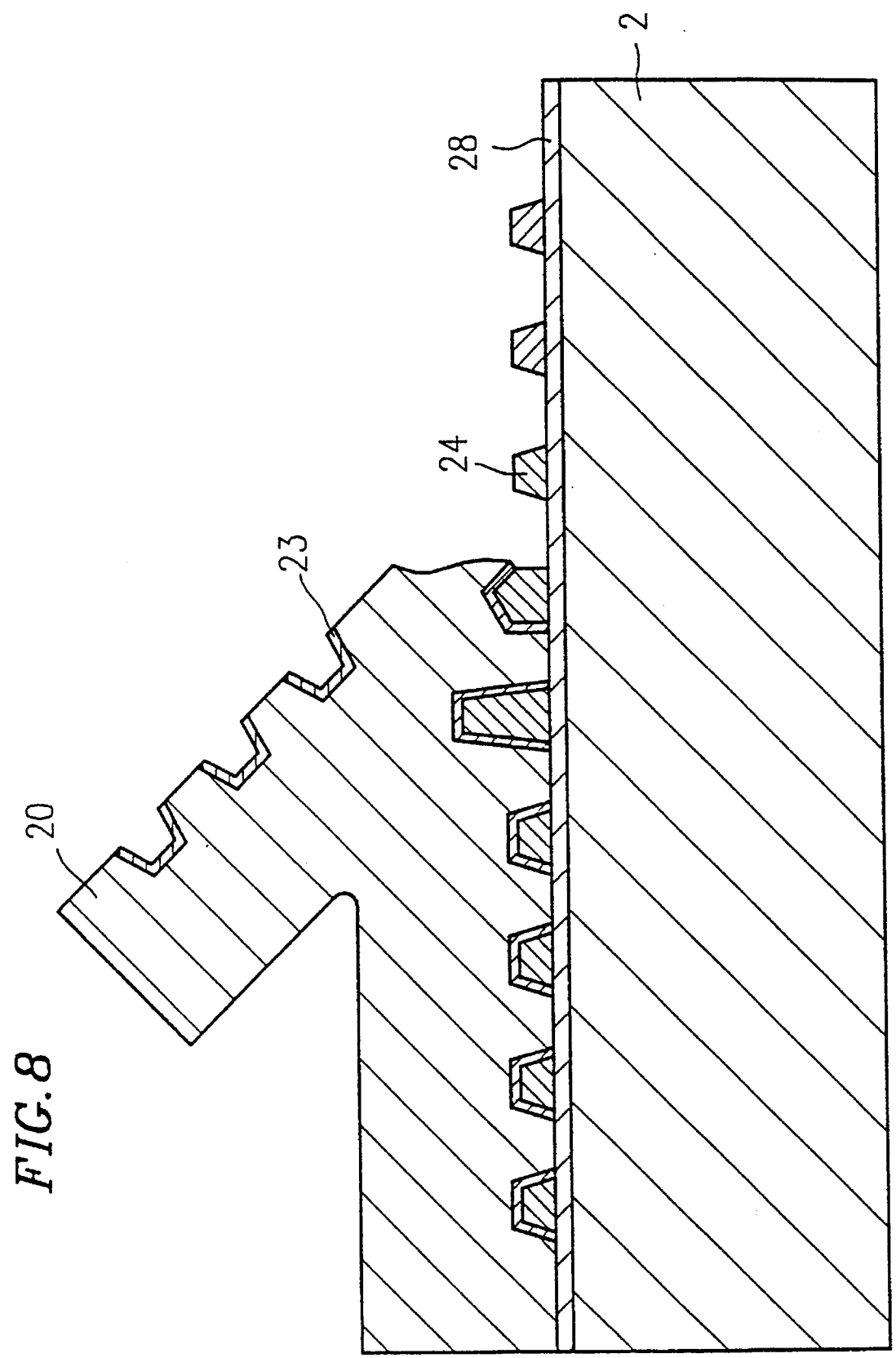

METHOD FOR FABRICATING AN ELECTRONIC PART BY INTAGLIO PRINTING

BACKGROUND OF THE INVENTION

1. Field of the Invention

The present invention relates to an electronic part used for electronic apparatuses of various types and a method for fabricating the same, and more particularly, to an electronic part fabricated by intaglio printing and a method of fabricating the same.

2. Description of the Related Art

In recent years, as electronic apparatuses become smaller, electronic parts used in the electronic apparatuses are more and more miniaturized. Under such conditions, conductor patterns are required to fulfill the following requirements: to have a fine conductor line (hereinafter simply referred to as line) constituting the conductor pattern; on increase in thickness of a conductive film constituting the conductor pattern in order to lower line-resistance; and to have a multilayered structure in order to miniaturize the electronic parts.

Conventional conductor patterns of the electronic parts are fabricated by printing a pattern of conductive paste such as a silver paste and a copper paste on an object (a substrate) employing printing techniques such as screen printing and intaglio printing, and then burning the printed object. As an application of the intaglio printing, there is the following printing method for forming a desired conductor pattern as disclosed in Japanese Laid-Open Patent Publication No. 4-240792. An intaglio plate corresponding to a conductor pattern to be formed is filled with conductor paste (organic metal ink). After the conductive paste is dried and cured, the pattern is transferred onto a substrate with a curable resin therebetween. As a result, a desired conductive pattern is formed.

In addition, for a hybrid IC circuit, a thermal head, or a transparent electrode, a method utilizing thin film formation and etching may be used. This is because the width of each line and the interval between the lines in the conductor pattern can be made finer by this method. The process of the method is as follows. A thin film made of a conductive material such as gold, aluminum, ITO or the like is formed by vapor deposition or sputtering. A mask pattern corresponding to the desired conductor pattern is formed by photolithography using a light-sensitive resin. Then, the thin film made of the conductive material is etched using an etchant and the mask pattern. Lastly, the light-sensitive resin is removed, thereby forming the conductor pattern.

The above conventional methods, however, have the following problems.

Conventional screen printing can be carried out with equipment at relatively low cost. Moreover the number of steps required to form the conductor pattern are few. However, it is very difficult to form a fine conductor pattern so that the width of the line of the conductor pattern to be formed is 70 μm or less by screen printing. Furthermore, it is also difficult to reduce a line pitch to 150 μm or less. In addition since the conductor pattern is uniformly formed by screen printing, it is impossible to make a difference in level (difference in height of the line) of the pattern according to design requirements.

It is possible to form such a fine conductor pattern so that the width of the line is about 50 μm and the line pitch is about 100 μm by conventional intaglio printing. However, it is difficult to form a conductor pattern having a thickness of 5 μm or more. Therefore, any decrease in the conductor resistance is limited to a certain extent.

On the other hand, making a fine conductor pattern in each layer is sometimes insufficient for obtaining the electronic parts with the desired high-density. Therefore, it is required to form a multilayered structure. Such a multilayered structure is formed by laminating several sandwich structures respectively including a lower layer conductor pattern, an insulating layer and an upper layer conductor pattern. In this case, it is necessary to form via holes for connecting conductor patterns of upper and lower layers to each other, which also necessitates making the via holes fine according to the fine conductor patterns. However, in conventional printing methods including the aforementioned method in Japanese Laid-Open Patent Publication No. 4-240792, it is very difficult to form the via-holes having a diameter of 100 μm or less.

Moreover, it is required to form electrodes for connecting the upper and lower layers within the via holes in order to obtain a reliable electrical connection between the conductor patterns of both layers. However, even if fine via holes having a diameter of 100 μm or less can be formed, it is difficult to form the electrodes in the via hole of such a small size by conventional methods.

In conventional intaglio printing, an intaglio plate made of rigid material such as glass or silicon wafer As generally used. In such a case, during the step of transferring the conductor pattern onto the object such as a ceramic substrate or a glass substrate with the curable resin therebetween, the intaglio plate is not sufficiently flexible when the intaglio plate and the object attached to each other are to be separated. As a result, a strong peeling force is required to separate them from each other off their surfaces.

In order to solve the above problems, a metal sheet having flexibility may be used as an intaglio plate. However, even in such a case, the shaping process (formation of a groove) of the intaglio plate is performed by wet etching which is isotropic etching, Therefore, the shaping of an intaglio plate with a high aspect ratio, that is required to form such a conductor pattern that the conductor film is thick (in other words, the line in the pattern is high) with respect to the width of the line, cannot be carried out.

On the other hand, as can often be seen in semiconductor techniques, the formation of the conductor pattern utilizing photolithography is useful in forming the pattern of a small area with the width of line of several μm or less. However, for forming the conductor pattern used in the electronic parts, it is generally required to form a pattern of a relatively large area. In such a case, it is required to conduct a series of steps including deposition of the conductive film, application of a resist, exposure, development, etching, and removal of the resist with large equipment. Since such equipment is generally expensive, the cost for fabricating the conductor pattern is likely to increase.

SUMMARY OF THE INVENTION

According to one aspect of the invention, a method for fabricating an electronic part including a first conductor pattern on a substrate by intaglio printing includes the steps of: (a) forming an intaglio plate by forming a groove on a surface of a flexible resin in a pattern corresponding to the first conductor pattern; (b) forming a release layer on the surface of the intaglio plate for facilitating the separation of the intaglio plate and the substrate; (c) filling conductive paste into the groove; (d) drying the conductive paste; (e) refilling the conductive paste so as to resoften the conductive paste dried in step (d) and compensate for the decrease in volume thereof and redrying the refilled conductive paste, the refilling and the redrying being repeated at predetermined times; (f) laminating the intaglio plate and the substrate at a temperature and pressure set in a predetermined range; (g) peeling the intaglio plate from the substrate so as to thereby transfer the pattern of the conductive paste onto the substrate; and (h) burning the transferred pattern of the conductive paste to thereby form the first conductor pattern.

According to another aspect of the invention, an electronic part includes: a substrate; and a first conductor pattern transferred onto a surface of the substrate by intaglio printing using an intaglio plate, the intaglio plate being formed with a flexible resin by a laser processing.

Thus, the invention described herein makes possible advantages of (1) providing a method for fabricating an electronic part capable of forming a fine conductor pattern having a line of 10 µm or less in width and of 5 µm or more in thickness and including a via hole electrode of approximately the same size as the line width at low cost with high reliability (2) providing a method for fabricating an electronic part capable of making a difference in level in the conductor pattern by making the thickness at a desired portion different from that of the other portion according to design requirements, (3) providing a method for fabricating an electronic part allowing the conductor pattern as described above to be multilayered, and (4) providing an electronic part fabricated by the methods as described above.

These and other advantages of the present invention will become apparent to those skilled in the art upon reading and understanding the following detailed description with reference to the accompanying figures.

BRIEF DESCRIPTION OF THE DRAWINGS

FIG. 8 is a schematic view showing a peeling step in an example of the present invention.

DESCRIPTION OF THE PREFERRED EMBODIMENTS

Figure 1A:
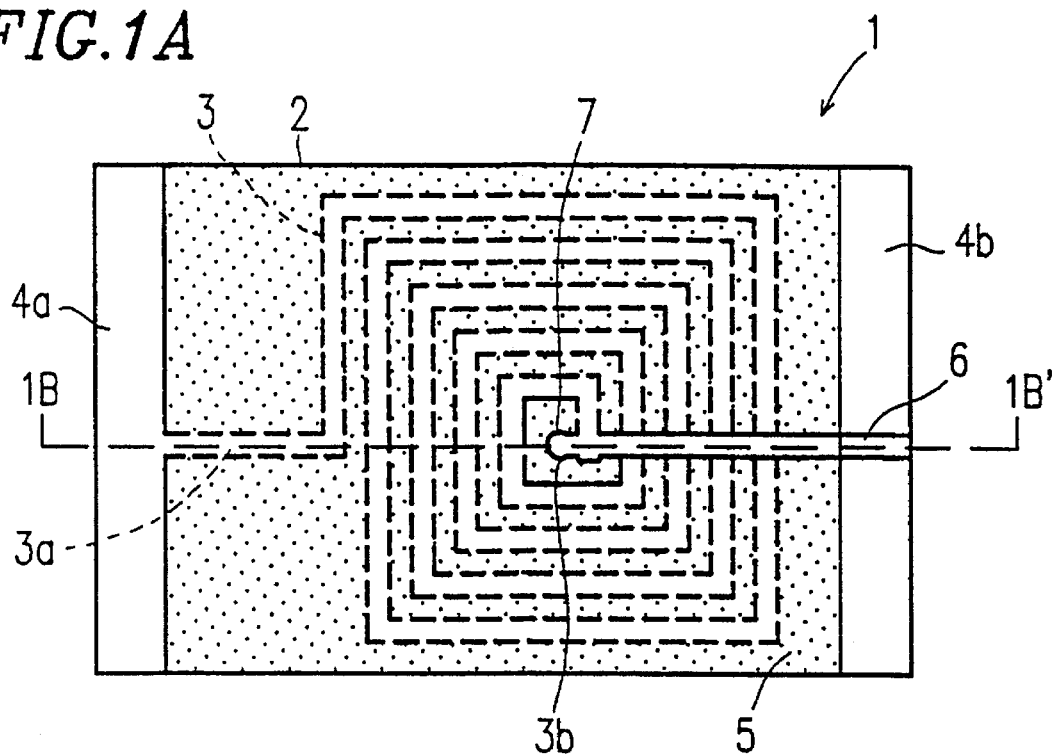
FIG. 1A is a plan view schematically showing a chip inductor fabricated in accordance with one example of the present invention.

Hereinafter, examples of the present invention will be described by way of illustrative examples with reference to the accompanying drawings.

Example 1

Hereinafter, a first example of a method for fabricating electronic parts is described with reference to FIGS. 1 to 10, taking a method for fabricating a chip inductor 1 for high-frequency as an example. In the figures, like components are indicated by the same reference numerals.

Figure 1B:
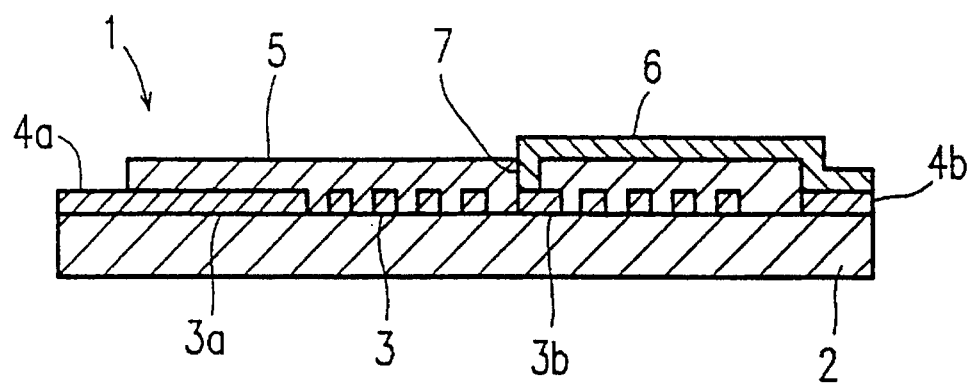
FIG. 1B is a cross-sectional view of the chip inductor taken along a line 1B–1B' of FIG. 1A.
Figure 2:
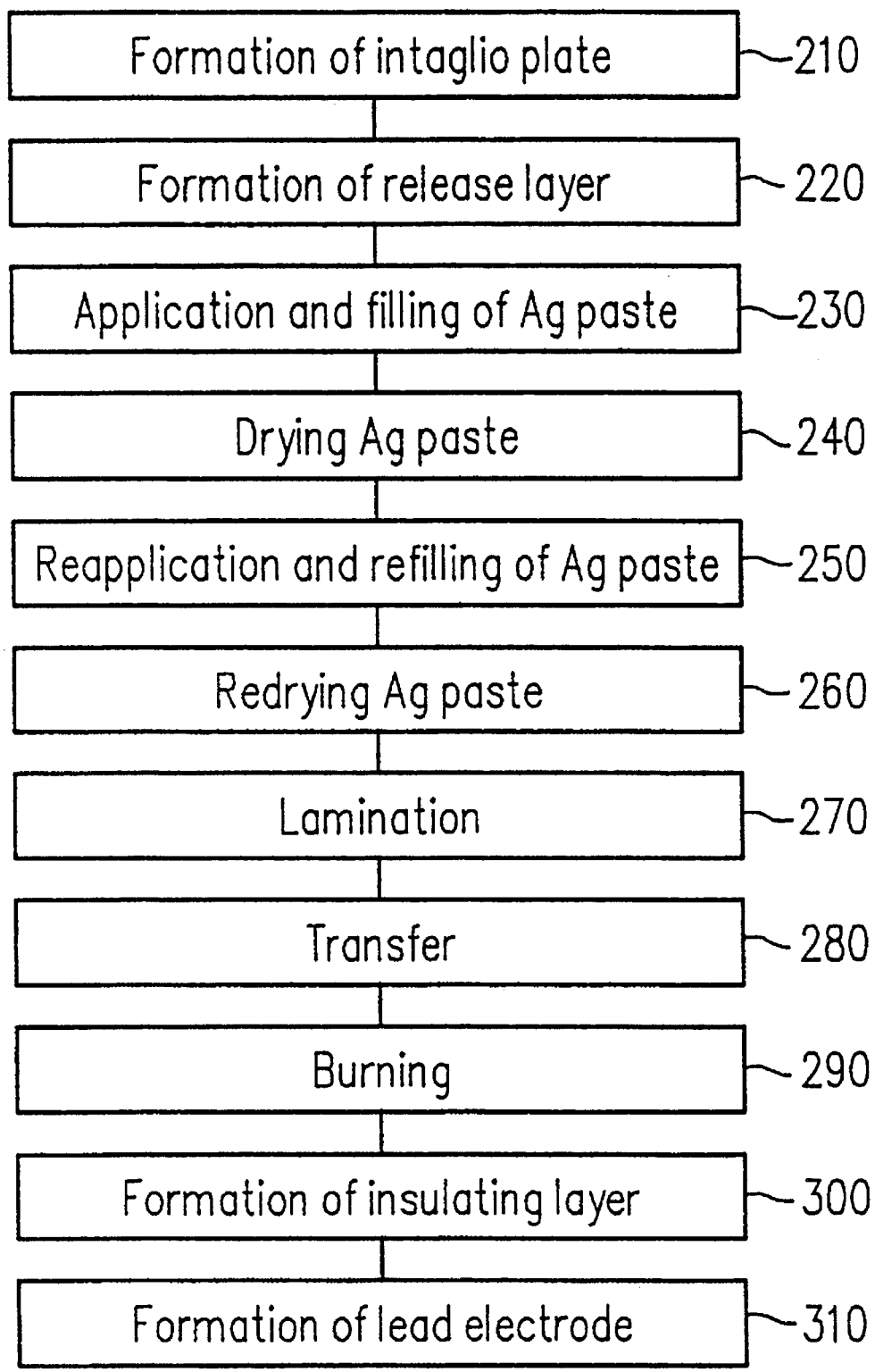
FIG. 2 is a flow chart showing the steps of a method for fabricating electronic parts in the example of the present invention.

FIG. 1A shows a plan view of the chip inductor 1 of Example 1, and FIG. 1B shows a cross-sectional view of the chip inductor 1 taken along a section line 1B–1B'.

The chip inductor 1 has an insulating substrate 2 having dimensions of 2×1.25 mm, a spiral coil conductor (line) 3 formed on the surface of the middle portion of the insulating substrate 2, and terminal electrodes 4a and 4b formed on the both end portions of the insulating substrate 2. An outer end 3a of the coil conductor 3 is connected to one terminal electrode 4a. An inner end 3b of the coil conductor 3 is connected to the other terminal electrode 4b through a lead electrode 6 and a via hole electrode 7. The lead electrode 6 is provided on the uppermost surface of an insulating layer 5 which is formed on the surface of the insulating substrate 1 so as to cover the coil conductor 3. The via hole electrode 7 connects the lead electrode 6 on the uppermost surface of the insulating layer 5 to the coil conductor 3 on the lowermost surface of the insulating layer 5.

The chip inductor 1 is fabricated by intaglio printing. Hereinafter, the method for fabricating the chip inductor 1 is described in due order. Steps 210 to 310 in the following description are shown in the block diagram of FIG. 2.

Figure 3:
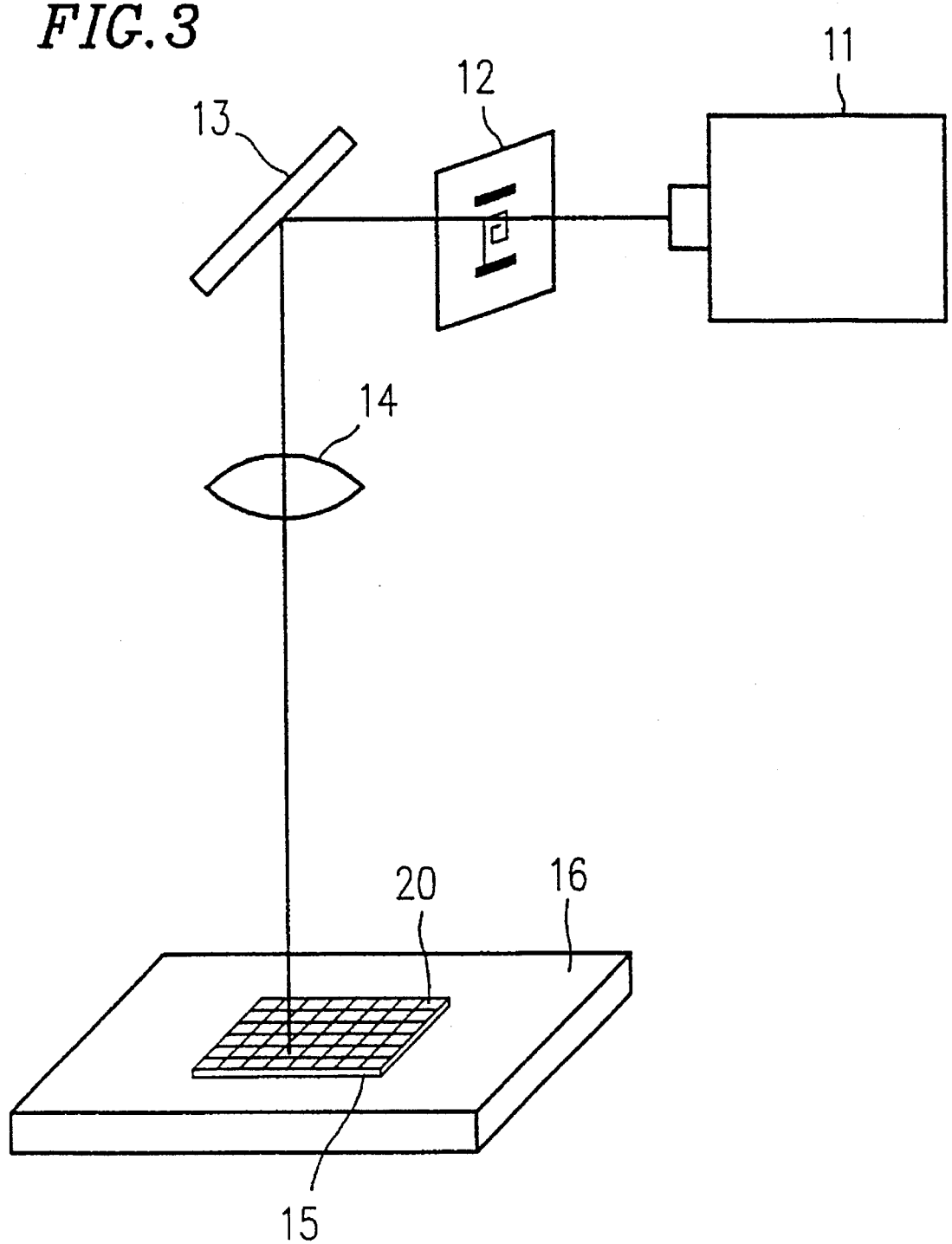
FIG. 3 is a schematic view showing a fabricating step of an intaglio plate in the example of the present invention.

First, referring to FIG. 3, Step 210 for forming an intaglio plate 20 used in the process is described. The intaglio plate 20 is formed on a flexible polyimide film 15 having a thickness of 125 µm and fixed on an XY stage 15. A laser beam, having a wavelength of 248 nm of the UV region, emitted from excimer laser apparatus 11 is incident on a mask 13 having a mask pattern corresponding to the spiral pattern of the coil and the pattern of the terminal electrodes to be thus formed. Passing through the mask 12 the laser beam is reflected by a mirror 13. Then after being reduced in size through an imaging lens 14 the laser beam is incident on the polyimide film 15, The portion of the polyimide film 15 illuminated by the laser beam is resolved by a photochemical reaction so as to form a groove 21 (see FIG. 4) corresponding to the lines of the conductor pattern. With the above process, the intaglio plate 20 corresponding to desired pattern is formed. About 4000 intaglio plates 20 having dimensions of 2×1.25 mm are typically formed on the polyimide film 15 having dimensions of 100 mm×100 mm by repeating the above incident operation while moving the XY stage 16.

A process using a carbon dioxide gas laser or a YAG laser is the thermal resolution process using a laser beam of the infrared wavelength region. On the other hand, the process using the excimer laser is a photo resolution process using a laser beam of the UV wavelength region having a peak power reaching several tens of MW. Moreover, since the pulse length of the laser beam is short, the thermal influence on the region surrounding the processed region is small. As a result, by the process using the excimer laser, a minute process so as to form the pattern having a line of 10 µm or less in width can be realized.

The portion of the surface of the polyimide film 15, on which the laser beam is incident, is in a chemically highly activated state since molecular bonds constituting the polyimide film 15 are broken Therefore, a chemical bonding is likely to occur in the region on which the laser beam is incident. This aspect is advantageous for forming the release layer described later.

Figure 4:
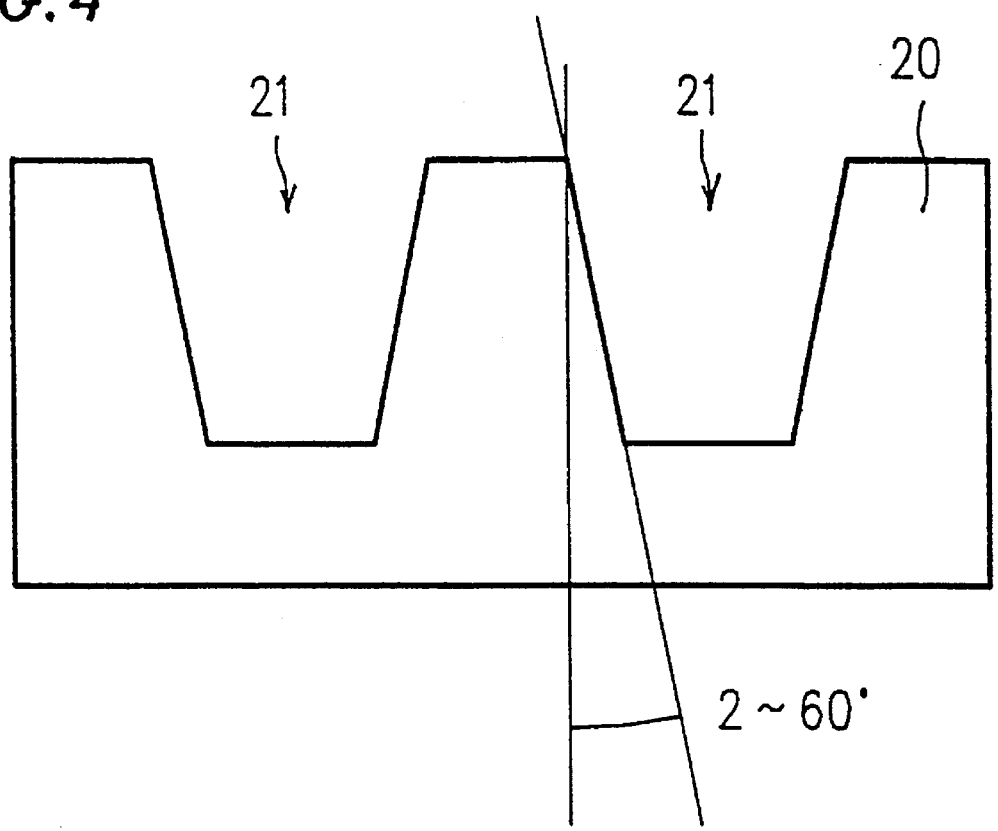
FIG. 4 is a cross-sectional view schematically showing the shape of grooves formed on a surface of the intaglio plate in the example of the present invention.
Figure 5:
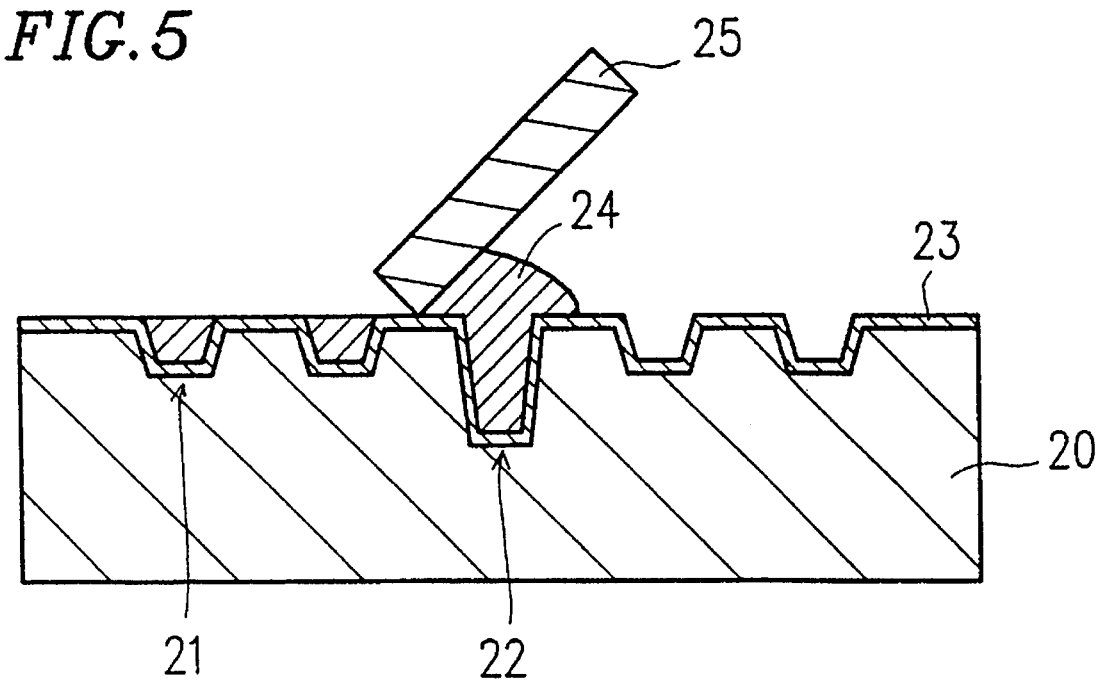
FIG. 5 is a schematic view showing a filling step of conductor paste into the intaglio plate in the example of the present invention.

FIG. 4 shows a typical cross-sectional shape of the groove 21 of the intaglio plate 20 formed by the above method. The groove 21 can be formed so as to have a trapezoidal cross-sectional shape having a side face with a tapered angle in the range of 2° to 60° by appropriately adjusting the characteristics of an optical system used in the laser processing step such as the focal depth of the lens. Owing to this, it is possible to easily transfer conductive paste filling the groove 21 on the object in the succeeding process. The laser beam typically has a rectangular shape of 8×24 mm in size when it is emitted from the laser apparatus 11, and a rectangular shape of 3.2×9.6 mm in size when it is incident on the polyimide film 15.

By providing an appropriate protecting layer on a surface of the polyimide film 15 to be processed into the intaglio plate 20, it is possible to protect a processed surface of the intaglio plate 20 from interaction with plasma generated while the groove 21 is being formed. With this protecting layer, it is possible to prevent openings of the groove 21 on the surface of the intaglio plate 20 from being deformed. As a material for the above-described protecting layer, for example, polyethylene terephthalate (PET), polycarbonate (PC) and polysulfone (PSF) may be used.

Next, the mask 12 is substituted by another mask for forming a via hole electrode 7. Then, the laser beam is incident on a predetermined position on the groove 21 of the conductor pattern formed in the previous process so as to form a cylindrical pit 22 (see FIG. 5) corresponding to the via hole electrode 7. In the formation of the pit 22, it is also possible to carry out a fine process as in the formation of the groove 21. In addition, it is possible to form the pit 22 so as to have a tapered shape in order to facilitate the transfer of the conductor past filling the pit 22. Alternatively, the pit 22 may have a different shape other than the cylindrical one.

With the method described above, the intaglio plate 20, which corresponds to the conductor pattern to be formed is formed, including the groove 21 having a depth of 20 µm corresponding to the line of 10 to 50 µm in width and the pit 22 having a diameter of 60 µm corresponding to the via hole electrode having a diameter of 45 µm. The depths of the groove 21 and the pit 22 can be arbitrarily changed by 0.2 µm as a unit and set at the most appropriate values by only changing the incident time period of the laser beam without affecting the width of the line (the width of the groove 21). The width of the groove 21 and the diameter of the pit 22 can be easily adjusted by modifying the size of the mask. Thus, according to the present invention, it is possible to reduce the line width of the conductor pattern to 10 µm or less or the size of the via hole so as to match with such a fine line.

By using the polyimide film 15 as a material of the intaglio plate 20, as described above, it becomes possible for the intaglio plate 20 to have flexibility. The effect obtained by this will be described later.

With the thus formed intaglio plate 20, the conductor pattern is transferred onto the surface of the object (the substrate). However, the polyimide film 15 which is used as a material of the intaglio plate 20 has insufficient release characteristics against the conductive paste, which is filled in the groove 21 and the pit 22 and then transferred. For this reason, the conductive paste tends to remain in the groove 21 and the pit 22 in the transferring step. Especially, in the pit 22 corresponding to the via hole electrode 7, the remaining conductive paste is most likely to be found since the pit 22 is deep. This results in insufficient transfer. Therefore, in order to realize a substantially complete transfer from the intaglio plate 20 to the substrate, Step 220 of forming a release layer on the surface of the intaglio plate 20, especially on the surface of the groove 21 and the pit 22, is required.

In order to solve the above problems, the inventors closely examined the release layer treatment on the polyimide film 15, especially from the viewpoints of the peeling force for the conductive paste and the life of the release layer. As a result, it is confirmed that to form the release layer made of fluorine-carbon type monomolecular film by the following method is most effective.

First, oxygen plasma is incident on the surface of the intaglio plate 20 by an $O_2$ asher, there by increasing the density of oxygen included in the surface of the intaglio plate 20. On the other hand, a certain solution is prepared, in which a non-aqueous solvent mixed with a substance including fluorine carbon groups and chlorosilane groups, for example $CF_3(CF_2)_7(CH_2)_2SiCl_3$, is dissolved at the concentration of about 1% in a mixed solution of n-hexadecane (alternatively, toluene, xylene, or dichlorohexyl may be used) 80%, carbon tetrachloride 10% and chloroform 8%. The intaglio plate 20 treated with oxygen as described above is dipped into the resultant solution so as to form an oxide film on the surface thereof. A large number of hydroxyl groups are included in the surface of the thus formed oxide film and therefore react with SiCl groups of the substance including fluorine-carbon groups and chlorosilane groups to cause a dechlorination reaction. As a result, a fluorine-carbon monomolecular film, which is chemically absorbed by a covalent bonding, is formed on the entire surface of the intaglio plate 20. The monomolecular film effectively functions as a release layer 23 (see FIG. 5).

The portions requiring the strong peeling force in the peeling step are mainly the groove 21 and the pit 22, and therefore, it is desirable to form the release layer 23 on these portions. On the other hand, as described above, the portion of the polyimide film 15 constituting the intaglio plate 20 in which the groove 21 and the pit 22 are formed by the process using the excimer laser is in a chemically activated state. Therefore, the release layer 23 made of a fluorine-carbon monomolecular film described above is more bonded to the inside of the groove 21 and the pit 22 requiring the large peeling force during the peeling step. Moreover, since the release layer 23 and the intaglio plate 20, i.e., the above monomolecular film and the polyimide film 15 are bonded through covalent bonding, their bonding is extremely strong which leads to the durability of the release effect. Furthermore, since the thickness of the release layer 23 is a small value, such as in the range of 10 to 1000 angstroms, the accuracy of the form of the intaglio plate 20 is not affected and therefore it is possible to fill the intaglio plate 20 with a large amount of conductive paste.

As described above, the release layer 23 formed on the surface of the intaglio plate 20 in Step 220 has excellent characteristics.

Next, as Step 230, Ag paste 24 as the conductive paste is applied on the surface of the intaglio plate 20, on which the release layer 23 is formed. Then, the applied surface of the intaglio plate 20 is scratched by a squeegee 25, thereby removing the extra Ag paste 24 on the surface of the intaglio plate 20 as well as thoroughly filling the groove 21 and the pit 22 with the Ag paste 24 (See FIG. 5).

According to the inventors' study on the material of the squeegee 25, it is preferred to use the squeegee 25 made of ceramic. Because a squeegee made of resin or steel is likely to be damaged by extraneous substances included in the Ag-paste 24 and/or dust existing on the surface of the intaglio plate 20. Therefore, the surface of the intaglio plate 20 in turn is likely to be damaged by the flaws of the surface of a resin or steal squeegee, resulting in a short life span of the intaglio plate 20. On the other hand, since the ceramic squeegee 25 is rigid, the tip thereof is less damaged by the extraneous substance and/or dust. Furthermore, by smoothing the tip of the ceramic squeegee 25 with a fine abrasive of No. 2000 or more, it is possible to prevent the wastage due to abrasion for a long time. Thus, the ceramic squeegee 25 hardly causes any damage on the surface of the intaglio plate 20.

Next, the intaglio plate 20 filled with the Ag paste 24 is dried using a circulating type hot air dryer, thereby evaporating the organic solvent included in the Ag paste 24 (Step 240). By this step, it is possible to obtain a sharper Ag shape by more suitably fitting the Ag paste 24 to the groove 21 and the pit 22 of the intaglio plate 20. The drying means is not limited to the above method.

The relatively deep groove 21 and the pit 22 are formed on the surface of the intaglio plate 20 described in Example 1. Especially, the pit 22 has a maximum depth of 60 μm. So, if the intaglio plate 20 is rapidly dried at a temperature of 100° C. or more in the drying step 240, pin holes having a diameter in the range of 5 to 40 μm are likely to be formed in the Ag paste 24 filled into the groove 21 and the pit 22. In such a fine conductor pattern that the width of a line is 50 μm or less, the pin holes cause a disconnection of the conductor pattern after the burning thereof and therefore inhibit the formation of a high quality conductor pattern.

Thus, the present invention adopts the drying step 240 which consists of two stages: a first stage of predrying at a temperature of 100° C. or less for 5 minutes and a second stage of drying at a temperature of 150° C. for 5 minutes. This prevents the pin hole formation and thus it is possible to form the conductor pattern without disconnection after the burning Alternatively, it is possible to obtain the same advantage of inhibiting the pin hole formation as described above by raising the temperature from room temperature to 150° C. with a moderate increase rate of 15 ° C./minute or less in place of the predrying.

After the Ag paste 24 filling the groove 21 and the pit 22 is dried or cured in the above Step 240, the flexibility of the Ag paste 24 is likely to be lost. As a result, cracking tends to occur in the Ag paste 24 due to the stress generated during the pattern transfer in the case where the conductor pattern with a fine line width (for example, 100 μm or less) is transferred, causing the disconnection of the conductor pattern after the burning. In order to avoid such a disadvantage, a plasticizer as much as 0.1 to 10 wt % is added to the Ag paste 24. With the addition of the plasticizer, it is possible for the Ag paste 24 to have the appropriate flexibility after drying and therefore to prevent the cracking in the transfer step. As a plasticizer, an ester phthalate type plasticizer, for example, dimethyl phthalate, diethyl phthalate, or dioctyl phthalate, can be used.

After the above drying step 240, the volume of the Ag paste 24 filling the groove 21 and the pit 22 is reduced by the amount corresponding to the evaporated organic solvent. In order to fill up the reduced amount, the filling step and the drying step of the Ag paste 24 is repeated once more. The Ag paste 24 previously cured by the evaporation of the organic solvent in the previous drying Step 240 is re-softened by the refilling of the Ag paste 24. By the refilling step 250 and the redrying step 260, the Ag paste 24 filling the groove 21 and the pit 22 can be put in a even better shape, and the thickness of the Ag paste 24 can be set at the same value as the depth of the groove 21 and the pit 22 of the intaglio plate 20.

If the Ag paste 24 remains on the unpatterned portion of the intaglio plate 20, especially, on each portion between the grooves 21, it may cause short circuits between the lines of the conductor pattern. Since the Ag paste 24 has viscosity and therefore tends to rope, the roping phenomenon occurs during the scratching operation by the squeegee 25. As a result, the Ag paste 24 remains on the portion where the Ag paste 24 should be removed. However, when the refilling is carried out in the state where the dried Ag paste 24 exists in the groove 21 and the pit 22, the solvent of the Ag paste 24 newly applied to the unpatterned portion is absorbed by the dried Ag paste in the groove 21 and the pit 22, thereby increasing the viscosity of the Ag paste 24 remaining on the unpatterned portion. As a result, the roping phenomenon does not occur when the Ag paste 24 on the unpatterned portion is removed by the squeegee 25. Therefore, the Ag paste 24 remaining on the unpatterned portion can be removed with ease. Accordingly, the conductor pattern, in which the short circuit between the lines does not occur, can be formed.

In the description of Example 1, the refilling step 250 and the redrying step 260 are repeated once, respectively. However, Steps 250 and 260 may be repeated twice or more, as required.

Figure 6:
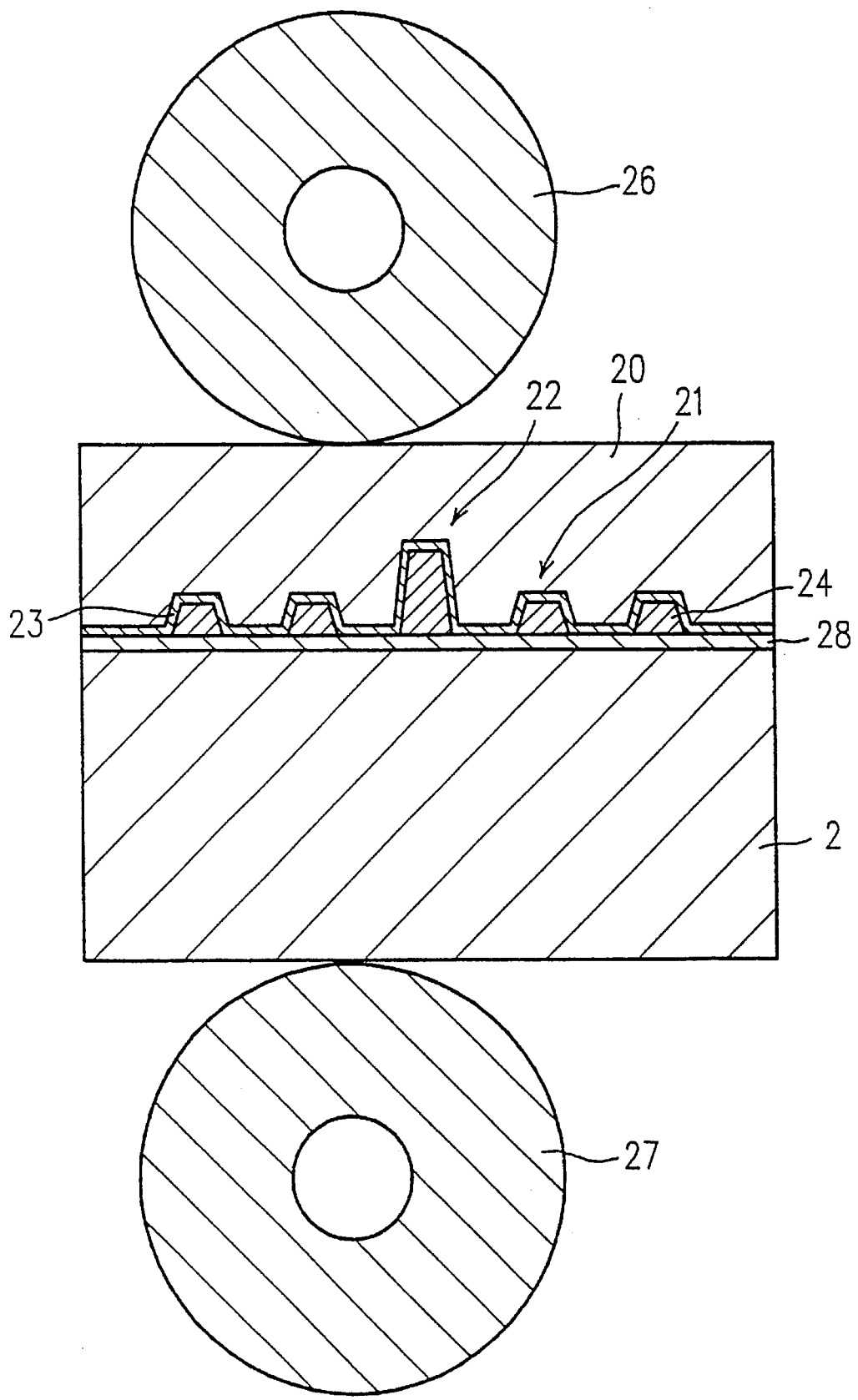
FIG. 6 is a schematic view showing a laminating step in the example of the present invention.

Next, a thermoplastic resin layer 28 is formed on an insulating substrate 2, thereby obtaining an object onto which the conductor pattern is transferred. The thermoplastic resin layer 28 functions as an adhesive layer when the conductor pattern is transferred. As schematically shown in FIG. 6, the intaglio plate 20 and the insulating substrate 2 are laminated together so that the surface of the intaglio plate 20, on which the groove 21 and the pit 22 filled with the Ag paste are formed as described above, and the thermoplastic resin layer 28 face each other (Step 270).

As described later, if the thermoplastic resin layer 28 is excessively thick, a large amount of combustion gas of the thermoplastic resin layer 28 itself is generated during burning, and therefore the conductor pattern is not formed in a good condition. An examination carried out by the inventors confirmed that a preferable thickness of the thermoplastic resin layer 28 is 20 µm or less.

It is desirable that the temperature during the laminating step 270 is set in the range from temperature lower than the glass-transition temperature of the used thermoplastic resin layer 28 by 30° C. to on higher than that by 100° C. If the laminating temperature is higher than the upper limit described above the Ag paste 24 does not transfer well from the groove 21 and the pit 22 of the intaglio plate 20 This is because the thermoplastic resin layer 28 has too much fluidity at the temperature above the upper limit, and therefore the thermoplastic resin layer 28 is thinned by the pressure during lamination.

On the other hand, if the laminating temperature is lower than the lower limit described above, the Ag paste 24 will not transfer well from the groove 21 and the pit 22 of the intaglio plate 20, either. This is because the thermoplastic resin layer 28 does not have sufficient fluidity at the temperature below the lower limit, and therefore the Ag paste 24 and the thermoplastic resin layer 28 are not sufficiently attached to each other.

Furthermore, it is desirable that the pressure during the lamination is set in the range from 1 kg/cm$^2$ to the critical pressure at which the insulating substrate 2 is cracked. If the pressure is lower than that of the lower limit described above, the intaglio plate 20 and the insulating substrate 2 are not perfectly attached to each other and contain bubbles therebetween in the case where the surface of the insulating substrate 2 has undulation. This phenomenon causes an insufficient transfer of the Ag paste 24 in some cases. So the laminating step 270 is conducted under the following conditions in Example 1.

First, a solution of butylcarbitolacetate, in which polyvinylbutyral resin (hereinafter, abbreviated as PVB) is dissolved, is applied to the surface of a square insulating substrate 2, 100 mm×100 mm, made of alumina and then dried. With this process, a PVB layer 28 having a thickness of 10 µm is formed on the entire surface of the insulating substrate 2. Next, the insulating substrate 2, on which the PVB layer 28 is formed, and the intaglio plate 20 filled with the Ag paste 24 are laminated together under the conditions of a temperature of 100° C., a pressure of 20 kg/cm$^2$ and a speed of 5 cm/second, using thermal rollers 26 and 27 as shown in FIG. 6. The PVB layer 28 may be applied by the dipping method, spinner method, or coating method using roll coaster. Although the PVB layer 28 is formed on only one surface of the insulating substrate 2 in Example 1, the PVB layer 28 may be formed on both the surfaces of the insulating substrate 2.

Figure 7A:
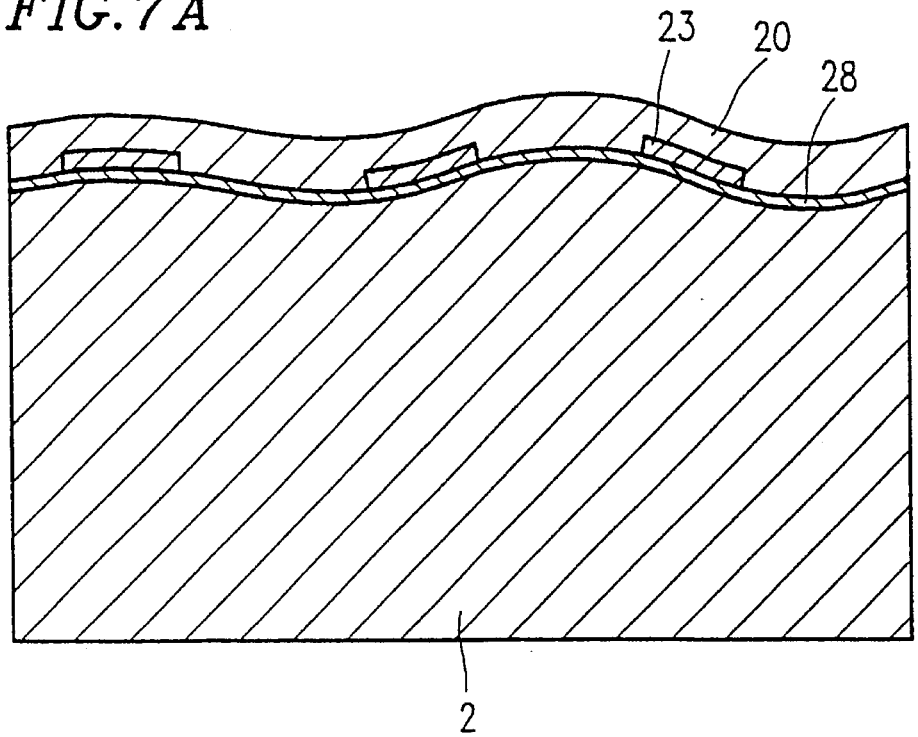
FIG. 7A is a cross-sectional view schematically showing a laminated state of a polyimide intaglio plate and an insulating substrate in the example of the present invention.
Figure 7B:
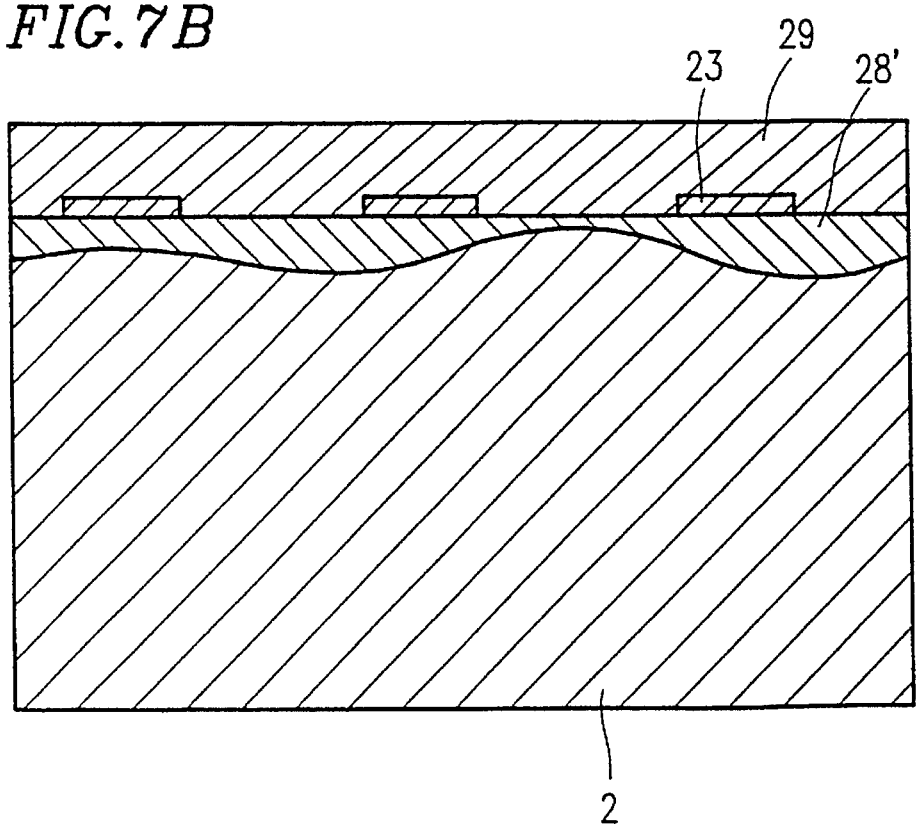
FIG. 7B is a cross-sectional view schematically showing a laminated state of a conventional glass intaglio plate and an insulating substrate.

In general, the surface of the insulating substrate 2 has an undulation with a maximum width of about 30 µm as diagrammatically shown in FIGS. 7A and 7B. In the case where an intaglio plate 29 made of glass is used as in the conventional process, the glass intaglio plate 29 has too strong a rigidity to sufficiently follow the undulation shape of the insulating substrate 2 as shown in FIG. 7B. For this reason, the intaglio plate 29 and the insulating substrate 2 should be laminated by using an uneven PVB layer 28' having a thickness in the range of 10 to 50 µm so as to absorb the undulation. For this reason, it is impossible to form the PVB layer 28' having the thickness in the preferred range (20 µm or less) described above.

However, according to the structure of the present invention using the intaglio plate 20 made of resin having good flexibility, as shown in FIG. 7A the intaglio plate 20 can sufficiently follow the undulation of the insulating substrate 2. Therefore it is possible to form the PVB layer 28 having a thickness of 10 µm or less on the insulating substrate 2 regardless of the undulation of the insulating substrate 2.

Next, transfer step 280 is conducted. The temperature of the laminated intaglio plate 20 and the insulating substrate 2 is lowered to room temperature, and then the intaglio plate 20 is peeled from the insulating substrate 2, thereby transferring the patterned Ag paste 24.

Since the intaglio plate 20 has much greater flexibility, it is possible to bend the intaglio plate 20 to 90° or more as shown in FIG. 8. As a result, the peeling of the intaglio plate 20 from the insulating substrate 2 is a peeling action of a line from the face. Therefore, it is possible to peel the intaglio plate 20 with ease since the required peeling force is lowered.

On the other hand, in the case where the conventional glass intaglio plate 29 having strong rigidity (see FIG. 7B) is used, a large peeling force is required since it is impossible to bend the intaglio 29 to the angle shown in FIG. 8 and therefore it becomes a peeling action of a face from a face. More over, if the conventional intaglio plate 29 is excessively bent, cracking easily occurs in the intaglio plate 29 or the insulating substrate 2. Therefore much attention needs to be paid to the peeling of the intaglio plate 29 from the insulating substrate 2. Thus, operational efficiency is low, and as a result operational costs and operation time is increased.

According to the present invention, even if the intaglio plate 20, for example, having a first pattern including a groove with a width of 15 µm and depth of 20 µm is used, the Ag paste 24 does not remain in the groove 21. Thus, the conductor pattern having substantially the same width as that of the groove 21 and a height substantially the same as the depth of the groove 21 can be transferred and formed. As for via hole electrode, in the case where the pit 22 of the intaglio plate 20 has a diameter of 45 µm and a depth of 60 µm, the conductor pattern having the dimensions substantially perfectly corresponding to the pit 22 can be transferred and formed. In addition, the conductive lines and the via hole electrodes are formed simultaneously and integrally in the same step, and thus electrical connection therebetween is surely attained.

Furthermore, for electronic parts used in a high-frequency region such as the chap inductor 1, it is necessary to make the surface shape of the conductor pattern as sharp as possible in order to improve electric operating characteristics by lowering the skin resistance. However, since wet etching employed for forming a conventional copper plate and a glass intaglio plate is isotropic etching, it is impossible to process the intaglio plate 20 with a high aspect ratio. Thus, it becomes more difficult to form a deep groove as the pattern becomes finer and therefore the width of a line to be formed becomes thinner. Moreover, edge portions of the groove are not sharply formed but rounded. On the other hand, if the intaglio plate 20 is processed by the excimer laser as in the present invention, it is possible to form the pattern having acute edges. Furthermore, as described above, since the Ag paste 24 does not remain in the groove 21 and the pit 22 during the transfer of the pattern, the pattern having the sharp shape similar to that of the acute intaglio plate 20 is transferred. Therefore, the conductor pattern formed according to the present example has excellent characteristics as a conductor for high-frequency.

Figure 9:
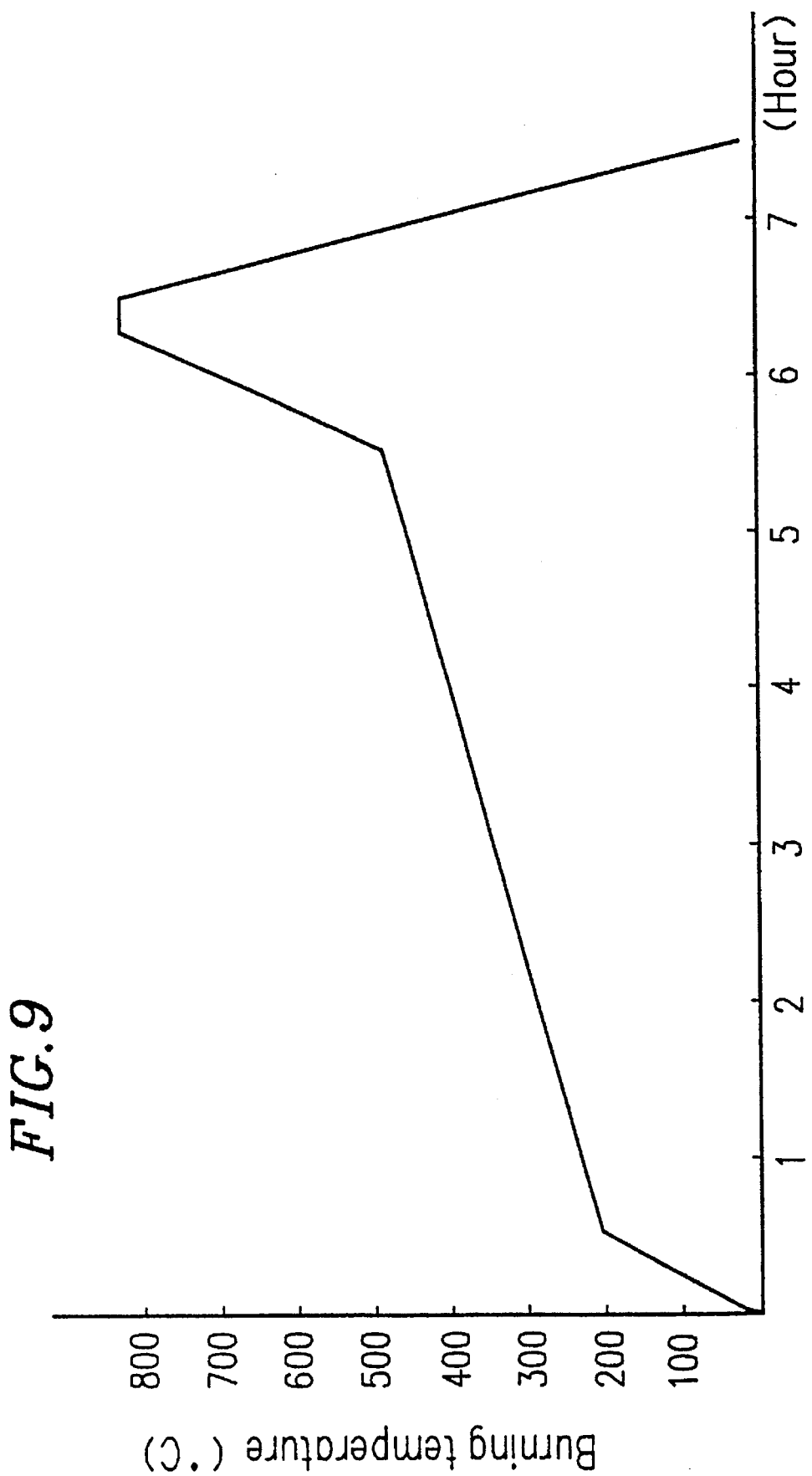
FIG. 9 is a graph showing burning temperature conditions in a burning step in the example of the present invention.
Figure 10:
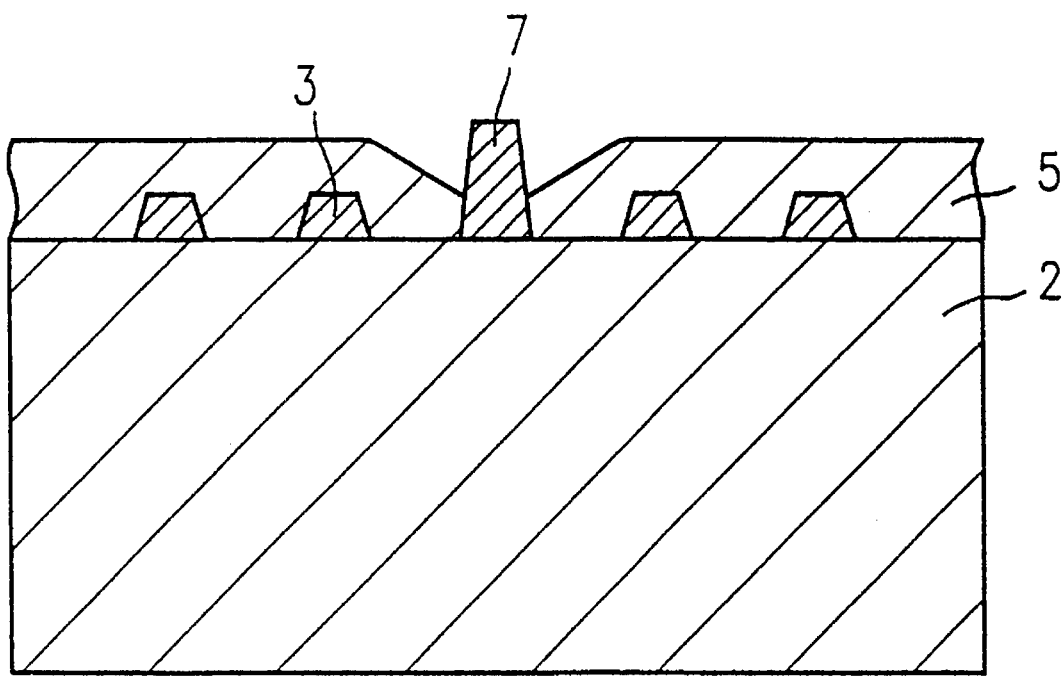
FIG. 10 is a cross-sectional view schematically showing a shape of a via hole formed in the example of the present invention.

Next, Step 290 for burning the insulating substrate 2, onto which the conductor pattern has been transferred as described above, is carried out under the temperature pattern with the peak temperature of 850° C. shown in FIG. 9. Since the insulating substrate 2 which is to be burnt in the present invention has the structure in which the conductor pattern is formed on the PVB layer (a resin layer) 28, combustion gas may be generated from the PVB layer 28 (depending on the burning conditions), resulting in the peeling or deformation of the conductor pattern and causing defects thereof. In order to prevent such disadvantages, it is desirable to set the temperature increase rate from 200° C. to 500° C. (corresponding to the temperatures at which the combustion of the PVB layer 28 is started and completed, respectively ) at 200° C./hour or less.

As already described in conjunction with the laminating Step 270, the relation between the thickness of the PVB layer 28 and the performance of the formed conductor pattern in the case where the burning step 290 is carried out under the conditions described above is shown in Table 1.

TABLE 1

| Thickness of PVB film | Pattern shape after burning | Peeling of pattern after burning |
| --- | --- | --- |
| 10 μm | ○ | ○ |
| 20 μm | ○ | ○ |
| 30 μm | X | Δ |
| 50 μm | X | X |
| 100 μm | X | X |

Criteria for evaluation
In an alumina substrate of a size of 100 mm × 100 mm (2 × 1.25 mm in size 400 pieces)
○ - Desirable products: 95% or more
Δ - Desirable products: 70% or more
X - Desirable products: 70% or less It is understood from Table 1 that when the thickness of the PVB layer 28 is 20 μm or less, a desired conductor pattern can be burnt without causing deterioration in shape and the peeling. However, if the thickness of the PVB layer 28 is 30 μm or more, the shape of the pattern is insufficiently formed and the undesirable peeling of the pattern is found. Therefore, it is characteristically advantageous for the PVB layer 28 to have a small thickness. By the comparison between the polyimide intaglio plate 20 of the present invention and the conventional glass intaglio plate 29, referring to FIGS. 7A and 7B, it is understood that the conductor pattern of a higher quality is formed by using the polyimide intaglio plate 20 of the present invention, since the thickness of the PVB layer 28 remains within a preferable range.

According to the method of the present invention, it is possible to integrally and simultaneously form the line 3 in the conductor pattern and the via hole electrode 7. Thus, reliable electrical connection between line 3 and the via hole electrode 7 can be obtained.

Next, in order to form the insulating layer 5, a glass paste pattern is printed on the surface of the insulating substrate 2 on which the conductor pattern made of Ag paste 24 is formed in the above steps (Step 300). In this step, a portion corresponding to the via hole electrode 7 is printed by a crystallized glass with a viscosity of 200 thousands cps using a screen plate with a mask diameter of 150 μm As a result, bleeding of the print occurs around the via hole electrode 7 and therefore the thickness of the glass paste covering the periphery of the via hole electrode 7 becomes thinner than that in the other portion, thereby forming the via hole shape in the periphery of the via hole electrode 7.

Since the diameter of the via hole to be formed is defined by the shape of the via hole electrode 7, even a fine via hole, for example, having a diameter of about 40 μm which is conventionally difficult to form, can be easily printed and formed according to the present invention. Moreover, since such fine via holes can be formed, the number of turns of the spiral coil pattern can be increased, whereby an obtained inductance value can be increased.

The glass paste pattern printed as described above is burnt by keeping it at a peak temperature of 820° C. for 10 minutes so as to form the insulating layer 5. The crystallized glass used hardly flows during burning and the printed pattern shape can be kept in good condition.

In a conventional method, the via hole for connecting the conductor patterns of the upper and lower layers of the multilayered substrate to each other is formed in such a manner that an opening in the insulating layer is provided by patterning in screen printing or etching and then burying the via hole electrodes therein. In this method, however, if the via hole electrode is insufficiently buried, the upper and/or lower layer conductor patterns are not sufficiently electrically connected to the via hole electrode, thereby causing insufficient connection between the conductor patterns of the upper and lower layers in some cases. However, as described above, in the method according to the present invention, since the via hole electrode 7 is integrally and simultaneously formed with the conductor pattern of the lower layer, insufficient connection as described above does not occur.

Moreover, since the shape and thickness of the via hole electrode 7 can be optionally set, it is possible to surely connect the upper conductor pattern to the via hole electrode 7 by forming the via hole electrode 7 so as to protrude from the surface of the insulating layer 5 by several μm. Moreover, by forming the via hole electrode 7 to have a trapezoidal sectional shape in a plane perpendicular to the surface of the substrate 2, it is possible to obtain sufficient connecting strength required in the succeeding steps even when the fine via hole electrode 7 is formed.

Lastly, Step 310 for forming a lead electrode 6 on the insulating layer 5 is carried out. The pattern of the lead electrode 6 is printed on the surface of the insulating layer 5 by screen printing using the Ag paste and then burnt at a peak temperature of 810° C. for 10 minutes, thereby forming the lead electrode 6. With the formation of the lead electrode 6, the chip inductor 1 of Example 1 is fabricated.

In the above description, the method for fabricating the electronic parts according to Example 1 is described, taking the chip inductor 1 as an example. However, it goes without saying that the electronic part to be fabricated in accordance with the present invention is not limited to the chip inductor 1. Other electronic parts can be formed such as a chip bead, a EMI filter, a condenser and the like, and any electrode portion of the electronic parts having a multilayered structure.

In the above description, after the conductor pattern is transferred and formed in Steps 210 to 290, the insulating layer 5 and the lead electrode 6 are formed in Steps 300 and 310. Alternatively, in the case where a conductor pattern which does not require such a structure is formed, a desired conductor pattern can be obtained through Steps 210 to 290 and Steps 300 and 310 do not have to be carried out.

Although the Ag paste is used as the material of the conductor paste used for forming the conductor pattern, the material for the conductor paste is not limited thereto. For example, other metal pastes such as Cu, Ni, Al, and Au pastes, or resinate paste can be used. Alternatively, in place of the conductive paste containing the organic solvent, the conductive paste containing a UV-curable resin or a thermosetting resin having an appropriate flexibility after being cured may also be used.

As a material of the intaglio plate 20 besides the polyimide film 15 described above, a resin sheet of, for example, PET, PSF, PC, PEI (polyetherimide), PAR (polyacrylate), or PEEK (polyetheretherketone) may be used as long as they have an appropriate flexibility. As a material of the resin layer 28 formed on the insulating substrate 2, an ethyl cellulose type thermoplastic resin, or an epoxy or acrylic type thermosetting resin may be used.

Furthermore, in the laminating step of the intaglio plate 20 and the insulating substrate 2 in the above description, the apparatus for thermally laminating while applying pressure using the thermal rollers 26 and 27 is used. However, a pressing apparatus having a heating plate on at least one side may be used instead.

The material of the insulating substrate 2 constituting the object for transferring and forming the conductor pattern thereon is not limited to specific materials, and materials generally used such as ceramic can be used. Alternatively, a dielectric material including barium titanate as a main material may also be used.

Especially in the case where the inductance parts are formed, At is desirable that at least one of the insulating substrate 2 and the insulating layer 5 is formed of a magnetic material such as ferrite. This is because a magnetic permeability increases the resultant inductance value of the electronic parts to be formed.

Alternatively, the object can be formed of green sheet. Since the green sheet has such a property that it is softened by heating, the formation of the resin layer 28, functioning as an adhesive layer when the conductor pattern is transferred in Step 270, can be omitted in the case where the object is formed using the green sheet.

The excimer laser apparatus 11 is used for forming the intaglio plate 20. However, other laser sources such as a dye laser or a free electron laser can be used as long as they are capable of emitting a laser beam having a wavelength of the UV region. Furthermore, other light sources can also be used as long as they are capable of emitting a beam with an energy density having a similar level to that of the above lasers in the above wavelength region.

Example 2

A second example of the present invention is described, taking a hybrid IC (hereinafter, abbreviated as HIC) substrate as an example, with reference to FIGS. 11 to 14. In these figures, like components are indicated by the same reference numerals.

Figure 11A:
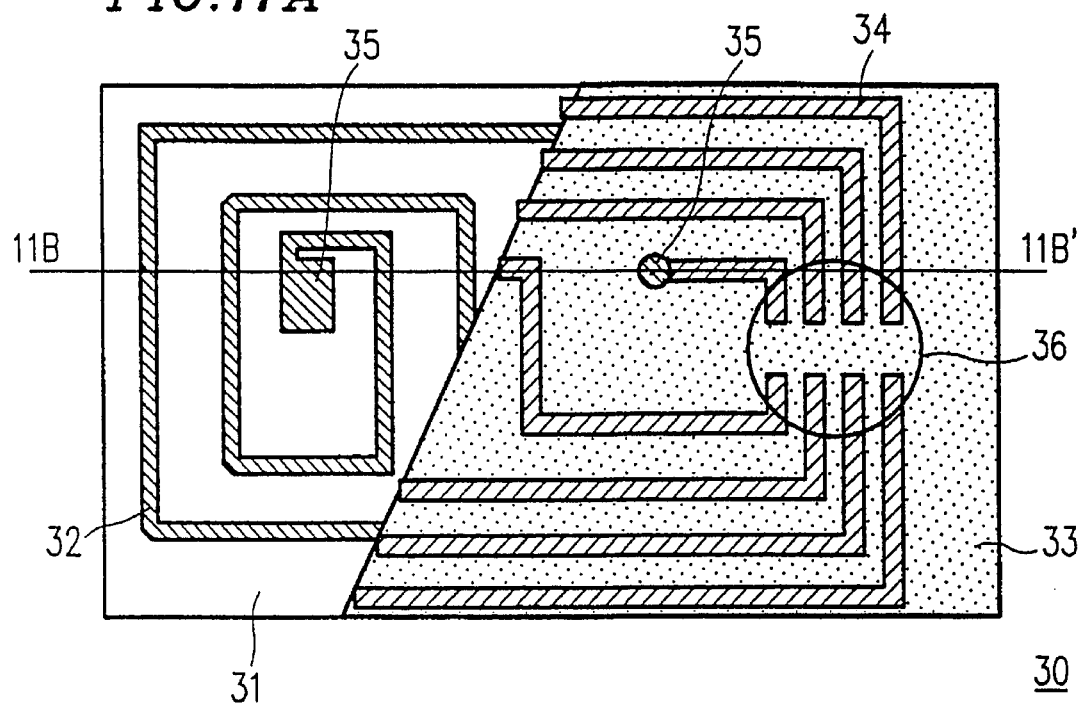
FIG. 11A is a plan view schematically showing a hybrid IC substrate fabricated in accordance with another example of the present invention.
Figure 11B:
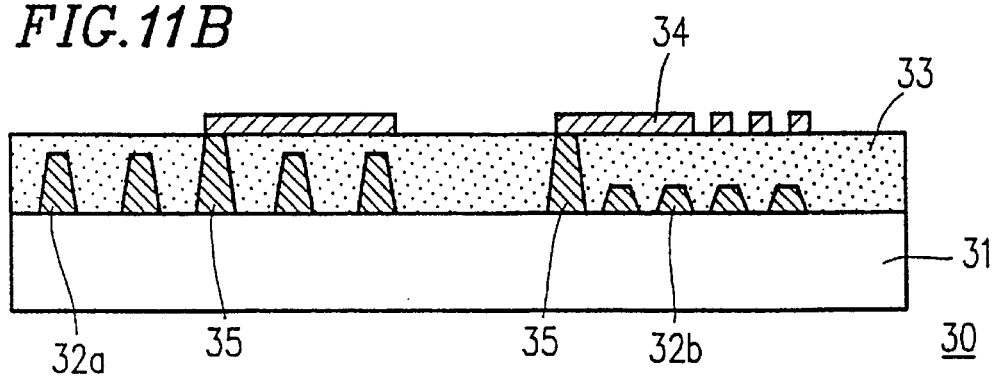
FIG. 11B is a cross-sectional view of the hybrid IC taken along a line 11B–11B' of FIG. 11A.

FIG. 11A shows a plan view of an HIC substrate 30, and FIG. 11B is a cross-sectional view of the HIC substrate 30 taking along a line 11B–11B' of FIG. 11A. The right part of FIG. 11A shows the portion where the conductor pattern of the upper layer is formed, and the left part shows the portion when the conductor pattern of the lower layer is formed. Since FIGS. 11A and 11B schematically show the structure of the HIC substrate 30, the conductor patterns in the figures do not precisely reflect the values of the size described below.

The HIC substrate 30 has a double-layered wiring structure including a lower layer conductor pattern 32 formed on an insulating substrate 31, an insulating layer 33 formed so as to cover the lower layer conductor pattern 32, and an upper layer conductor pattern 34 formed on the insulating layer 33. As can be seen from FIG. 11B, the lower layer conductor pattern 32 includes a spiral coil conductor portion 32a and the other conductor potion 32b. The lower layer conductor pattern 32 and the upper layer conductor pattern 34 are connected to each other through a via hole electrode 35. A mounting portion 36 for facedown mounting of an IC chip is provided on the portion of the upper layer conductor pattern 34.

In view of the electrical characteristics, a conductor pattern, for example, having a pitch of 60 μm (i.e., a width of each line is 30 μm and an interval between the lines is 30 μm) and a height (i.e., the thickness of a conductor film) of 35 μm, is formed in the portion of the lower layer conductor pattern 32 corresponding to the coil conductor portion 32a. The via hole electrode 35 is formed so as to have a height (i.e., a thickness of the conductor film) of 50 μm so that the tip of the via hole electrode 35 protrudes from the surface of the insulating layer 33, thereby surely connecting the conductor patterns of the upper and lower layers 32 and 34. On the other hand, the facedown mounting portion 36 of the upper layer conductor pattern 34 is formed with, for example, a pitch of 150 μm (i.e., a width of each line is 75 μm and an interval between the lines is 75 μm).

Furthermore, the facedown mounting portion 36 is required to have such a flatness that the undulation for 5 mm of the surface an length is 3 μm or less from restriction in the facedown mounting conditions of the IC chip. In this case, when the height (the thickness of the conductor film) of the conductor pattern 32b positioned below the facedown mounting portion 36 is 5 μm or more, the undulation of the surface of the insulating layer 33 becomes larger, thereby making it difficult to perform the facedown mounting. Therefore, the height of the conductor portion 32b is restrained so as not to exceed 5 μm.

As described above, in Example 2 of the present invention, the conductor pattern having a difference in level is formed by altering the thickness of the conductor film (the height of the line) at arbitrary positions in the conductor pattern to be at a desired level. With this process, the HIC substrate 30 enabling the facedown mounting of the IC chip at a predetermined position of the uppermost surface of the upper layer conductor pattern 34 is formed.

Hereinafter, a method for fabricating the HIC substrate 30 of the present example will be described. Each step such as the forming step of the intaglio plate in the following description is substantially equivalent to each corresponding step of Example 1, except that the shape of the conductor pattern to be formed is different. Therefore, the detailed description on its properties and the like is omitted.

First, an intaglio plate for forming the lower layer conductor pattern 32 is formed on a polyimide film in the following order by employing the excimer laser, using three types of masks, i.e., a mass for forming the coil conductor portion 32a, a mask for forming the other conductor portion 32b of the lower layer conductor pattern 32, and a mask for forming the via hole electrode 35. First, a pattern which consists of a groove of 45 μm in depth corresponding to the coil conductor portion 32a Is formed using the mask corresponding to the pattern of the coil conductor portion 32a. Next, a pattern which consists of a groove of 65 μm in depth corresponding to the via hole electrode 35 is formed using the mask corresponding to the pattern of the via hole electrode 35. Lastly, a pattern which consists of a groove of 10 μm in depth corresponding to the conductor portion 32b is formed using the mask corresponding to the pattern of the conductor portion 32b. The relative position of each pattern is aligned to an accuracy within 5 μm, thereby forming the intaglio plate for forming the lower layer conductor pattern 32.

On the thus formed intaglio plate, a release layer made of a fluorine-carbon monomolecular film is formed as in Step 220 of Example 1. Next, as in Step 230 of Example 1, each groove of the intaglio plate is filled with the Ag paste using the squeegee made of ceramics. Thereafter, as in Step 240, the Ag paste is dried by the circulating type hot air dryer so as to evaporate the organic solvent included therein thereby reducing the volume of Ag paste filling the groove of the intaglio plate by the amount corresponding to the evaporated organic solvent. Furthermore, as in Steps 250 and 260, after the groove is refilled with the Ag paste, the Ag paste is dried in two stages. By repeating the steps of filling the groove with the Ag paste and drying the Ag paste as in Example 1, the thickness of the film of Ag paste can be substantially the same as the depth of each groove.

Next, as in Step 270, the thermoplastic resin layer having a thickness of 10 μm is formed on the surface of the insulating substrate 31. Then, the intaglio plate and the insulating substrate 31 are laminated together at a pressure of 25 kg/cm$^2$ and a temperature of the substrate of 130° C. Thereafter, the temperature of the substrate is lowered to room temperature and the intaglio plate is peeled from the insulating substrate 31, thereby transferring the conductor pattern onto the insulating substrate 31. Furthermore, as in Step 290, the insulating substrate 31, on which the conductor pattern has been transferred is subjected to the burning treatment by raising temperature to a peak value of 850° C. with a temperature increase rate of 200° C./hour.

With the series of steps described above, it is possible to simultaneously and integrally form the lower layer conductor pattern 32 and the via hole electrode 35, as in Example 1.

Next, as in Step 300, a pattern of an insulating layer 33 is formed on the insulating substrate 31 by screen printing of a glass paste Then, the insulating substrate 31 is burnt at a temperature of 840° C., thereby forming the insulating layer 33. By using the crystallized glass as in Example 1, the glass paste hardly flows during burning, Therefore, the shape formed by screen printing is kept in relatively good condition.

Next, a pattern corresponding to the upper layer conductor pattern 34 is formed by the screen printing of Ag paste, and then burnt by being kept at a peak temperature of 810° C. for 10 minutes so as to form the upper layer conductor pattern 34.

As in the above steps, a coil having excellent electrical characteristics as in Example 1 is formed by increasing the height of the line (the thickness of the conductor film) at the portion corresponding to the spiral coil conductor 32*a*. The via hole electrode 35 is formed so as to have a trapezoidal cross-section in a plane perpendicular to the surface of the substrate, thereby surely electrically connecting the upper layer conductor pattern 34 to the lower layer conductor pattern 32. Moreover, the thickness of the lower layer conductor pattern 32 is selectively thinned at a predetermined portion, thereby realizing desired flattening at a portion of the surface of the insulating layer 33 required to be flattened. With these processes, the HIC substrate 30, on which the IC chip can be mounted by facedown mounting, is fabricated.

The shape of the via hole electrode 35 is not limited to the one shown in FIG. 11B. For example as in the HIC substrate 40 shown in FIG. 12, it is possible to form an electrode 35' of the shape partly burying the via hole. Alternatively, the insulating layer 33 may be formed so as not to entirely cover the lower layer conductor pattern 32 by providing the via hole during the insulating layer formation. Then a electrode connecting the upper and lower layer conductor patterns 32 and 34 may be formed within the via hole as the subsequent step.

Figure 12:
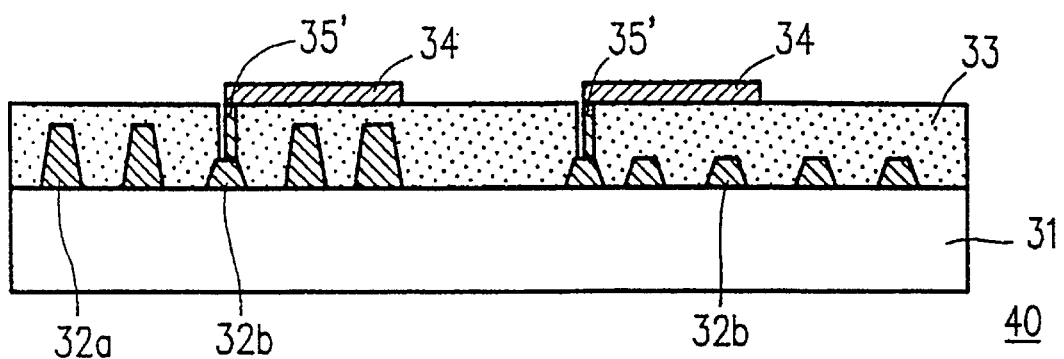
FIG. 12 is a cross-sectional view schematically showing another hybrid IC substrate fabricated in the present invention.
Figure 13:
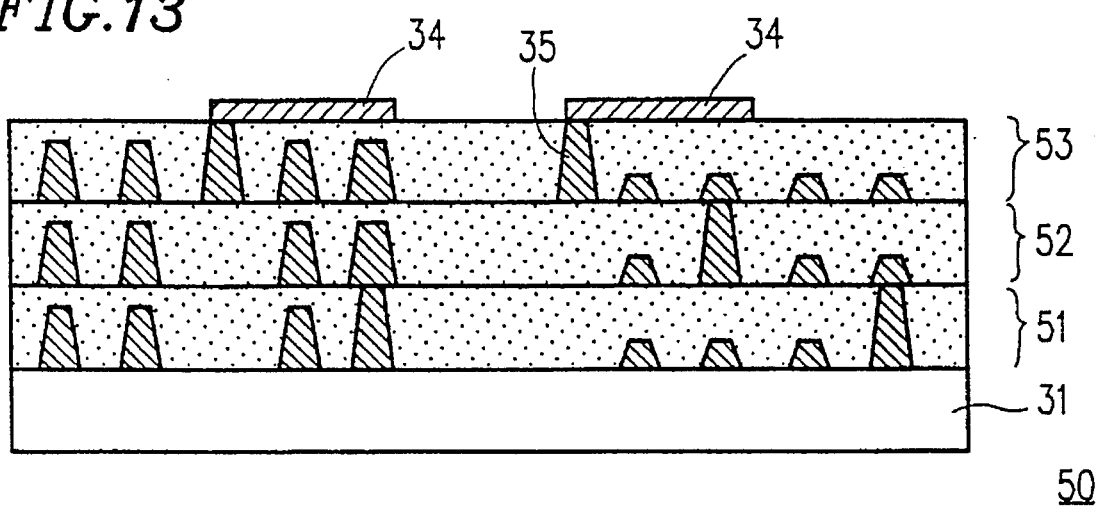
FIG. 13 is a cross-sectional view schematically showing still another hybrid IC substrate fabricated in the present invention.

Furthermore, in the above description, the present invention is described by taking the double-layered wiring substrate as an example. However, it is possible for the substrate to have a further multilayered structure. In the HIC substrate 50 shown in FIG. 13, conductor patterns 51, 52, and 53 respectively corresponding to the pattern of a single layer of the HIC substrates 30 or 40 shown in FIG. 11B or 12 are deposited so as to form a multilayered structure including three layers.

Figure 14:
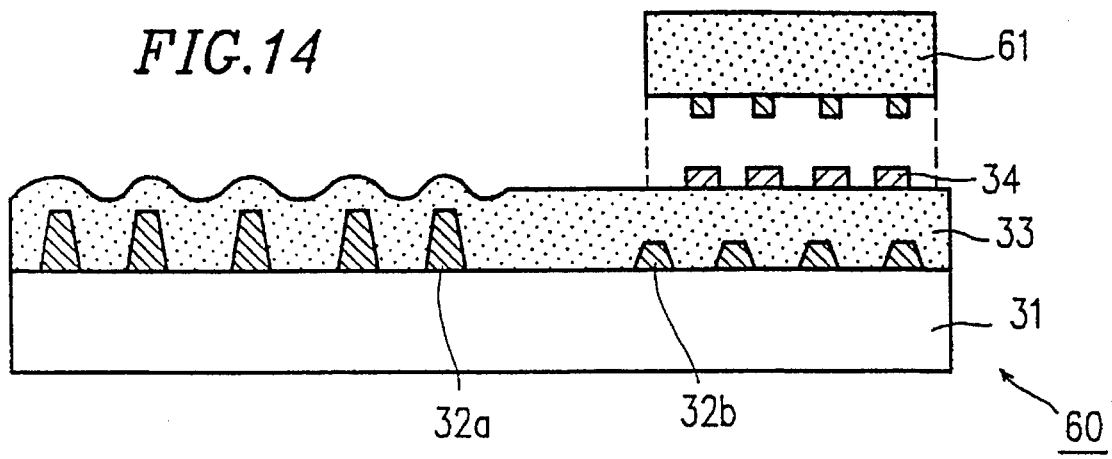
FIG. 14 is a cross-sectional view schematically showing still another hybrid IC substrate fabricated in the present invention.

Moreover, according to the present invention, it is possible to form lines in the conductor pattern so as to have a difference in level. Therefore, an HIC substrate 60 including an insulating layer 33 with a surface form as shown in FIG. 14 can be formed. In the HIC substrate 60, the conductor portion 32*a* of the lower layer conductor pattern corresponding to the portion in which the surface undulation of the insulating layer 33 is not required to be controlled is formed as a relatively high line (a thick conductor film). On the other hand, the conductor portion 32*b* corresponding to the portion in which %he surface of the insulating layer 33 is required to be flattened, such as the facedown mounting portion for an IC chip 61, is formed with a relatively low line (a thin conductor film). Conductor resistance increases as the height of the conductor portion 32*b* becomes lower. However, it is possible to restrain the disadvantageous effects on the electrical characteristics by setting the width of the lines of the conductor portion 32*b* at a large value as required.

As described above, according to the present invention, it is possible to obtain the most suitable form of the conductor pattern in consideration of the trade-off between the design requirement for the form of the surface of the insulating layer 33 and the requirement for the electrical characteristics of the conductor pattern.

As described above, according to the method for fabricating electronic parts of the present invention, a groove pattern corresponding to the yet to be formed conductor pattern is formed by an excimer laser on a surface of a resin sheet with a high flexibility, whereby an intaglio plate is formed. A conductive paste filling the groove pattern is substantially perfectly transferred on the substrate which is an object. Since it is possible to make the groove on the intaglio plate very sharp, the conductor pattern formed through burning after transfer also has a desired acute rectangular shape. With this shape, the electrical characteristics of the conductor pattern to be formed are improved.

As for the size, it is possible to form such a fine and thick conductor pattern that the width of lines in the conductor pattern is 10 μm or less and the thickness of the conductor film is 5 μm or more. Moreover, it is possible to thickly form the conductor film only for an optional predetermined portion, that is, to set the lines of the conductor pattern high. By applying these aspects, according to a method for fabricating electronic parts of the present invention, it is possible to form a via hole with a fine width substantially equivalent to the size of the fine conductor pattern. Therefore, a small electronic part having a multilayered structure, which was difficult to realize in conventional printing methods, can now be fabricated at low cost.

The present invention has been described above by taking a type of electronic part which requires the formation of the thick conductor film in the conductor pattern as an example. However, it is apparent to those skilled in the art that the method for fabricating electronic parts of the present invention is applicable to other electronic parts as well, i.e., especially, electronic parts which do not require to have a difference in thickness of the conductor film or the thick portion therein. Even in such a case, advantageous aspects of the invention, such as easily and surely peeling the intaglio plate from the insulating substrate in the transfer step by using the intaglio plate made of the flexible resin sheet and making the intaglio pattern acute and rectangular by forming the intaglio pattern with an excimer laser, make it possible to improve the characteristics of the electronic parts to be formed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating an electronic part comprising a first conductor pattern on a substrate by intaglio printing, the method comprising the steps of:
    (a) forming an intaglio plate by forming a groove on a surface of a flexible resin in a pattern corresponding to the first conductor pattern;
    (b) forming a release layer on the surface of the intaglio plate for facilitating the separation of the intaglio plate and the substrate, the release layer being a fluorine-carbon monomolecular film;
    (c) filling conductive paste into the groove;
    (d) drying the conductive paste;
    (e) refilling the conductive paste so as to resoften the conductive paste dried in step (d) and compensate for the decrease in volume thereof and redrying the refilled conductive paste, the refilling and the redrying being repeated at predetermined times;
    (f) laminating the intaglio plate and the substrate at a temperature and pressure set in a predetermined range;
    (g) peeling the intaglio plate from the substrate so as to thereby transfer the pattern of the conductive paste onto the substrate; and
    (h) burning the transferred pattern of the conductive paste to thereby form the first conductor pattern.

2. A method according to claim 1, wherein in the step (a), the groove is formed with a laser having a wave-length in a UV region.

3. A method according to claim 2, wherein the laser is an excimer laser.

4. A method according to claim 1, wherein a plasticizer is added to the conductive paste so as to have flexibility.

5. A method according to claim 1, wherein the groove formed on the surface of the intaglio plaza has a cross-sectional shape having a side face with a tapered angle.

6. A method according to claim 1, wherein the substrate comprises an insulating substrate and a resin layer formed at least on one surface of the insulating substrate, the resin layer having a thickness of 20 µm or less, the resin layer being one of a thermoplastic resin and a thermosetting resin.

7. A method according to claim 6, wherein the insulating substrate is formed of a dielectric material.

8. A method according to claim 1, wherein the substrate is formed of a green sheet.

9. A method for fabricating an electronic part comprising a first conductor pattern on a substrate by intaglio printing, the method comprising the steps of:
    (a) forming an intaglio plate by forming a groove on a surface of a flexible resin in a pattern corresponding to the first conductor pattern;
    (b) forming a release layer on the surface of the intaglio plate for facilitating the separation of the intaglio plate and the substrate;
    (c) filling conductive paste into the groove;
    (d) drying the conductive past;
    (e) refilling the conductive paste so as to resoften the conductive paste dried in step (d) and compensate for the decrease in volume thereof and redrying the refilled conductive paste, the refilling and the redrying being repeated at predetermined times;
    (f) laminating the intaglio plate and the substrate at a temperature and pressure set in a predetermined range;
    (g) peeling the intaglio plate from the substrate so as to thereby transfer the pattern of the conductive paste onto the substrate; and
    (h) burning the transferred pattern of the conductive paste to thereby form the first conductor pattern;
    wherein the substrate comprises an insulating substrate and a resin layer formed at least on one surface of the insulating substrate, the resin layer having a thickness of 20 µm or less, the resin layer being one of a thermoplastic resin and a thermosetting resin, and the insulating substrate is formed of a magnetic material.

10. A method for fabricating an electric part comprising a first and second conductor patterns on a substrate by intaglio printing, the method comprising the steps of:
    (a) forming an intaglio plate by forming a groove on a surface of a flexible resin in a pattern corresponding to the first conductor pattern;
    (b) forming a release layer on the surface of the intaglio plate for facilitating the separation of the intaglio plate and the substrate;
    (c) filling conductive paste into the groove;
    (d) drying the conductive paste;
    (e) refilling the conductive paste so as to resoften the conductive paste dried in the step (d) and compensate for the decrease in volume thereof, and redrying the refilled conductive paste, the refilling and the redrying being repeated at predetermined times;
    (f) laminating the intaglio plate and the substrate at a temperature and pressure set in a predetermined range;
    (g) peeling the intaglio plate from the substrate so as to thereby transfer the pattern of the conductive paste onto the substrate;
    (h) burning the transferred pattern of the conductive paste to thereby form the first conductor pattern;
    (i) forming an insulating layer so as to cover at least a portion of the first conductor pattern;
    (j) forming the second conductor pattern on a surface of the insulating layer; and
    (k) forming an electrode at an uncovered portion of the first conductor pattern with the insulating layer for electrically connecting the first and second conductor patterns.

11. A method according to claim 10, wherein the insulating layer is formed of a magnetic material.

12. A method for fabricating an electric part comprising a first and second conductor patterns on a substrate by intaglio printing, the method comprising the steps of:

(a) forming an intaglio plate by forming a groove on a surface of a flexible resin in a pattern corresponding to the first conductor pattern;

(b) forming a release layer on the surface of the intaglio plate for facilitating the separation of the intaglio plate and the substrate;

(c) filling conductive paste into the groove;

(d) drying the conductive paste;

(e) refilling the conductive paste so as to resoften the conductive paste dried in the step (d) and compensate for the decrease in volume thereof, and redrying the refilled conductive paste, the refilling and the redrying being repeated at predetermined times;

(f) laminating the intaglio plate and the substrate at a temperature and pressure set in a predetermined range;

(g) peeling the intaglio plate from the substrate so as to thereby transfer the pattern of the conductive paste onto the substrate;

(h) burning the transferred pattern of the conductive paste to thereby form the first conductor pattern;

(i) forming an insulating layer so as to cover at least a portion of the first conductor pattern; and (j) forming the second conductor pattern on a surface of the insulating layer, wherein in the step (a), a portion of the groove of the intaglio plate is formed so as to have a deeper depth than the other portions to thereby provide a difference in height at a portion of the first conductor pattern and form a raised portion of the first conductor pattern, the raised portion of the first conductor pattern being used as an electrode for electrically connecting the first and second conductor patterns.

13. A method according to claim 12, wherein a portion of the first conductor pattern corresponding to a position of the insulating layer at which a flat portion is to be provided on the surface thereof is made lower.

14. A method according to claim 13, further comprising the step of facedown-mounting an IC chip onto the flat portion on the surface of the insulating layer.

15. A method according to claim 12, wherein the insulating layer is formed of a magnetic material.

* * * * *

UNITED STATES PATENT AND TRADEMARK OFFICE
CERTIFICATE OF CORRECTION

PATENT NO. : 5,609,704

DATED : March 11, 1997

INVENTOR(S) : Masaaki Hayama et al.

It is certified that error appears in the above-identified patent and that said Letters Patent is hereby corrected as shown below:

Column 2, line 27, change "As" to --is--.

Column 5, line 24, insert --.-- between "broken" and "Therefore,".

Column 6, line 40, change "there by" to --thereby--.

Column 9, line 4, insert --a-- between "from" and "temperature".

Column 9, line 6, change "on" to --one--.

Column 10, line 45, change "chap" to --chip--.

Column 11, line 59, insert --.-- between "150 $\mu$m" and "As".

Column 14, line 59, change "Is" to --is--.

Column 15, line 38, insert --.-- between "paste" and "Then".

Column 16, line 27, change "%he" to --the--.

UNITED STATES PATENT AND TRADEMARK OFFICE
CERTIFICATE OF CORRECTION

PATENT NO. : 5,609,704
DATED : March 11, 1997
INVENTOR(S) : Masaaki Hayama, et. al.

It is certified that error appears in the above-identified patent and that said Letters Patent is hereby corrected as shown below:

Claim 5, line 2, change "plaza" to --plate--.

Signed and Sealed this

Tenth Day of February, 1998

Attest:

BRUCE LEHMAN

Attesting Officer       Commissioner of Patents and Trademarks